(12) United States Patent
Liao

(10) Patent No.: US 8,247,706 B2
(45) Date of Patent: Aug. 21, 2012

(54) ENCLOSURE OF AN ELECTRONIC DEVICE

(75) Inventor: Hsieh-Chou Liao, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 303 days.

(21) Appl. No.: 12/770,695

(22) Filed: Apr. 29, 2010

(65) Prior Publication Data

US 2011/0186348 A1     Aug. 4, 2011

(30) Foreign Application Priority Data

Feb. 4, 2010   (TW) .............................. 99103376 A

(51) Int. Cl.
*H01R 13/648*  (2006.01)
(52) U.S. Cl. ........................... 174/360; 174/656; 174/51
(58) Field of Classification Search .................. 174/561, 174/51, 360
See application file for complete search history.

(56) References Cited

U.S. PATENT DOCUMENTS

| | | | | |
|---|---|---|---|---|
| 5,174,768 A * | 12/1992 | Hewison et al. | ................. | 439/95 |
| 5,608,611 A * | 3/1997 | Szudarek et al. | ............. | 361/753 |
| 5,670,744 A * | 9/1997 | Ritchey | ............................ | 174/51 |
| 5,693,908 A * | 12/1997 | Amberger | ...................... | 174/656 |
| 5,763,830 A * | 6/1998 | Hsueh | ............................. | 174/60 |
| 5,939,673 A * | 8/1999 | Rentmore | ........................ | 174/59 |
| 6,462,943 B1 * | 10/2002 | Borkar et al. | ............ | 361/679.47 |
| 6,595,789 B2 * | 7/2003 | Oota et al. | ...................... | 439/98 |
| 7,005,575 B2 * | 2/2006 | Hedstrom | ....................... | 174/50 |
| 7,170,002 B2 * | 1/2007 | Thompson | ...................... | 174/51 |
| 7,244,895 B1 * | 7/2007 | Borzabadi | ..................... | 174/650 |
| 7,595,455 B2 * | 9/2009 | Robinson | ...................... | 174/655 |
| 7,994,434 B2 * | 8/2011 | Benner et al. | ................. | 174/360 |

\* cited by examiner

*Primary Examiner* — Hung Ngo
(74) *Attorney, Agent, or Firm* — Altis Law Group, Inc.

(57) ABSTRACT

An enclosure of an electronic device includes an upper shell, a lower shell mounted to the upper shell, and an electrical outlet mounted to the lower shell. The lower shell includes a front plate defining an opening. The electrical outlet includes a connector and a number of wires electrically connected to the connector. An electromagnetic interference absorbing magnetic ring fits about some of the wires. The lower shell further defines a cable channel extending through an edge of the front plate and communicating with the opening. The wires pass through the cable channel and extend through the opening to enter into the lower shell, with the connector covering the opening.

5 Claims, 2 Drawing Sheets

ENCLOSURE OF AN ELECTRONIC DEVICE

BACKGROUND

1. Technical Field

The present disclosure relates to an enclosure of an electronic device.

2. Description of Related Art

Generally speaking, a common electronic device, such as a computer or a server, needs an alternating current (AC) supply unit. The AC supply unit includes an enclosure, and an electrical outlet mounted on the enclosure. The electrical outlet includes a plurality of wires and an electromagnetic interference absorbing magnetic ring fitting about some of the wires. When the wires extend into the enclosure during assembly, the electromagnetic interference absorbing magnetic ring is easily scratched.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
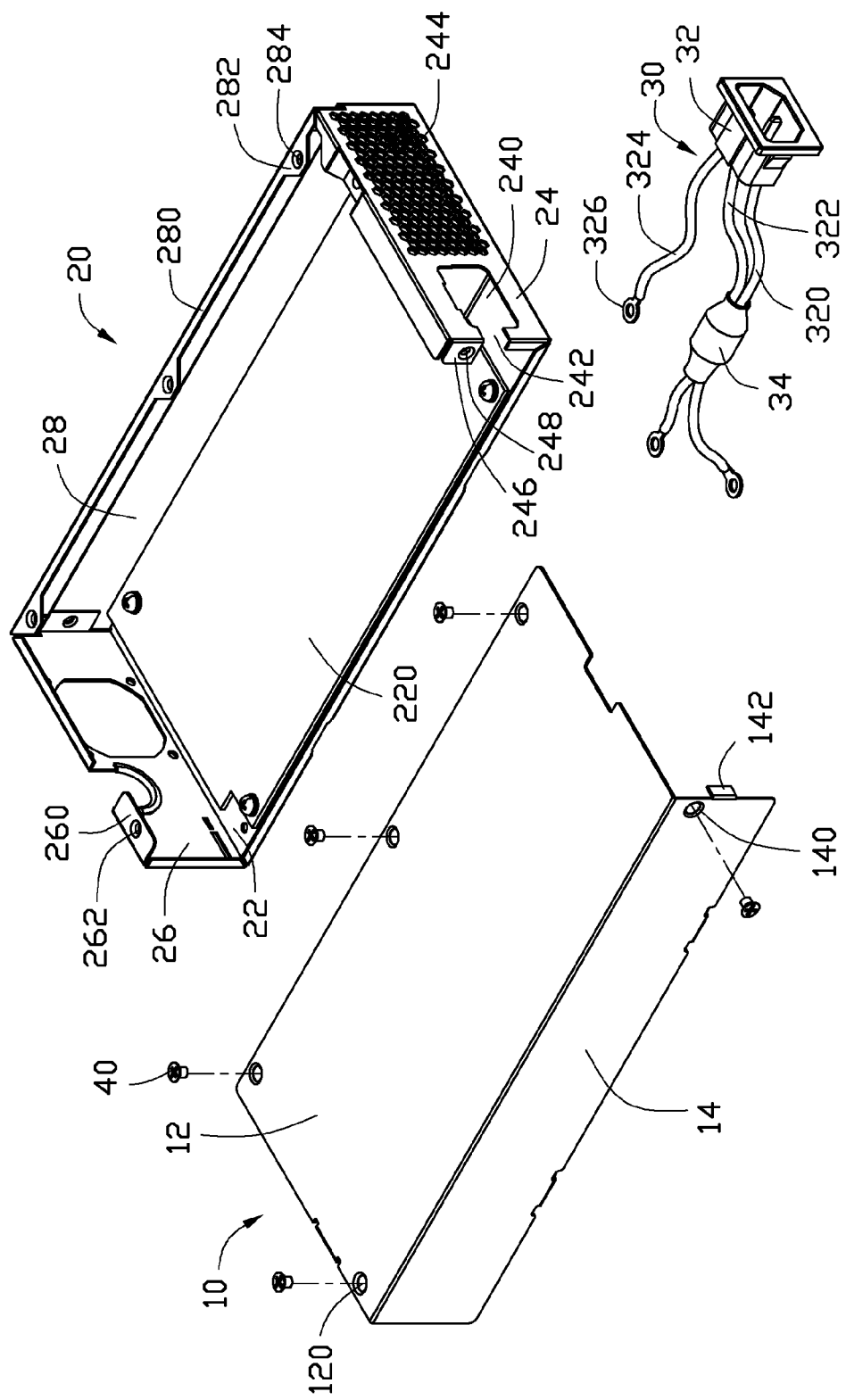
FIG. 1 is an exploded, isometric view of an exemplary embodiment of an enclosure of an electronic device.

Referring to FIG. 1, an exemplary embodiment of an enclosure of an electronic device includes an upper shell 10, a lower shell 20, an electrical outlet 30, and a plurality of fixing members 40. In this embodiment, the electronic device is an alternating current (AC) supply unit.

The upper shell 10 includes an upper plate 12 and a side plate 14 perpendicularly extending down from a first side of the upper plate 12. The upper plate 12 defines four through holes 120. One of the four through holes 120 is adjacent to the first side and a first end of the upper plate 12 perpendicular to the first side. The other three through holes 120 are located at a second side of the upper plate 12 opposite to the first side. A first side of the side plate 14 defines a through hole 140 therein, adjacent to the first side and a second end of the upper plate 12 opposite to the first end. A tongue 142 perpendicularly extends from an edge of the side plate, adjacent to the through hole 140.

The lower shell 20 includes a lower plate 22, a front plate 24 perpendicularly extending up from a front end of the lower plate 22, a rear plate 26 perpendicularly extending up from a rear end of the lower plate 22, and a side plate 28 extending up from a first side of the lower plate 22. A circuit board 220 is mounted on the lower plate 22. The circuit board 220 including many electronic elements of the AC supply unit. The front plate 24 defines a rectangle-shaped opening 240, a cable channel 242 adjacent to a second side of the lower plate 22 opposite to the first side and communicating with the opening 240, a plurality of ventilation holes 244 opposite to the cable channel 242 relative to the opening 240. A mounting piece 246 perpendicularly extends from the front plate 24 towards the rear plate 26, adjacent to the cable channel 242. The mounting piece 246 is above the cable channel 242 and defines a fixing hole 248. A mounting piece 260 perpendicularly extends from a top of the rear plate 26. The mounting piece 260 defines a fixing hole 262. A mounting piece 280 perpendicularly extends from a top of the side plate 28. The mounting piece 280 includes three protruding portions 282. The protruding portions 282 each define a fixing hole 284.

The electrical outlet 30 includes a connector 32, and a plurality of wires. The connector 32 includes a plurality of pins electrically connected to the wires. The pins include a live pin, a neutral pin, and a ground pin. The wires include a live wire 320, a neutral wire 322, a ground wire 324, correspondingly electrically connected to the live pin, the neutral pin, and the ground pin. The live wire 320, neutral wire 322, and ground wire 324 each connect to a conductive ring 326. An electromagnetic interference absorbing magnetic ring 34 fits about the live wire 320 and the neutral wire 322.

In this embodiment, each fixing member 40 is a screw.

Figure 2:
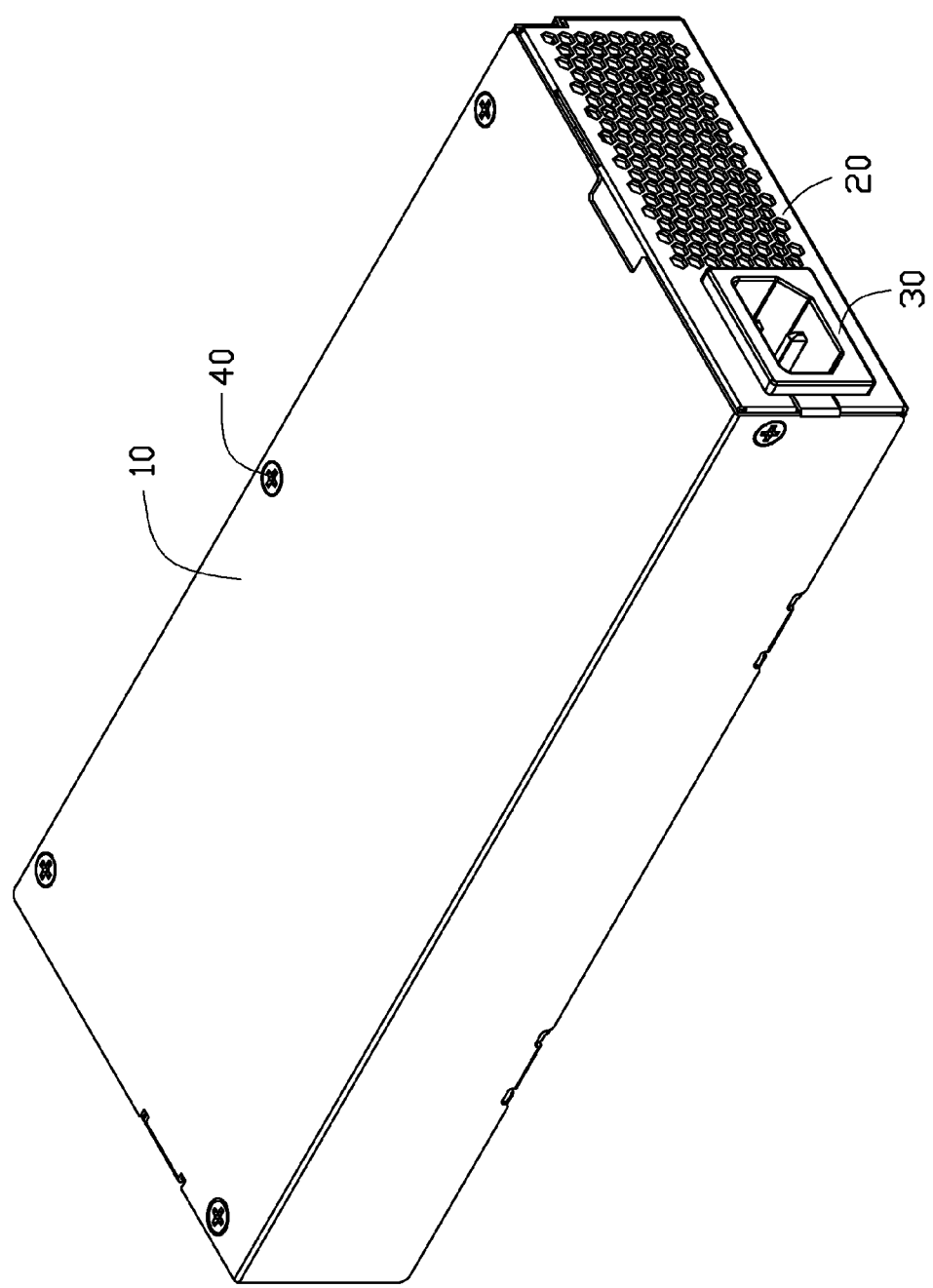
FIG. 2 is an assembled, isometric view of the enclosure of FIG. 1.

Referring to FIG. 2, in assembly, the live wire 320, neutral wire 322, ground wire 324 of the electrical outlet 30 pass through the cable channel 242 and extend through the opening 240 to enter into the lower shell 20, and are electrically connected to the circuit board 220 by the rings 326. Thus, the electromagnetic interference absorbing magnetic rings 34 is located in the lower shell 20 and not easily scratched. The connector 32 is exposed from the opening 240 and covers the opening 240. The upper shell 10 covers the lower shell 20, with the tongue 142 covering the cable channel 242, the through hole 140 aligning with the fixing hole 248, the through hole 120 adjacent to the first side and the first end of the upper plate 12 aligning with the fixing hole 262, and the three through holes 120 locating at the second side of the upper plate 12 aligning with the three fixing holes 284. The fixing members 40 extend through the through hole 140 and the four through holes 120 to lock in the fixing hole 248, the fixing hole 262, and the three fixing holes 284, thereby, the upper shell 10 is mounted on the lower shell 20.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An enclosure of an electronic device, the enclosure comprising:

a lower shell;

an upper shell covering the lower shell; and an electrical outlet mounted to the lower shell;

wherein the lower shell comprises a front plate defining an opening, the electrical outlet comprises a connector and a plurality of wires electrically connected to the connector, an electromagnetic interference absorbing magnetic ring fits about some of the wires; wherein the lower shell further defines a cable channel extending through an edge of the front plate and communicating with the opening, the plurality of wires passes through the cable channel and extend through the opening to enter into the lower shell, with the connector covering the opening.

2. The enclosure of claim 1, wherein the wires comprises a live wire, a neutral wire, and a ground wire, the electromagnetic interference absorbing magnetic ring fits about the live wire, and the neutral wire.

3. The enclosure of claim 1, wherein the upper shell comprises an upper plate and a side plate perpendicularly extending down from a first side of the upper plate, a tongue perpendicularly extends from a front end of the side plate to cover the cable channel.

4. The enclosure of claim 3, wherein the upper plate defines a plurality of first through holes, the lower shell further comprise a lower plate, a rear plate perpendicularly extending up from a rear end of the lower plate, and a side plate perpendicularly extending up from a side of the lower plate, the front plate is perpendicularly extended from a front end of the lower plate, the rear plate and the side plate define a plurality of first fixing holes corresponding to the first through holes, a plurality of first fixing members extend through the plurality of first through holes to lock in the plurality of first fixing holes.

5. The enclosure of claim 4, wherein a mounting piece perpendicularly extends from the front plate towards the rear plate, the mounting piece is above the cable channel and defines a second fixing hole, the first side of the side plate of the upper shell correspondingly defines a second through hole, a second fixing member extends through the second through hole to lock in the second fixing hole.

* * * * *